(12) United States Patent
Kobayashi et al.

(10) Patent No.: US 7,659,634 B2
(45) Date of Patent: Feb. 9, 2010

(54) LEAD FRAME, METHOD OF MANUFACTURING THE SAME, SEMICONDUCTOR DEVICE USING LEAD FRAME AND METHOD OF MANUFACTURING SEMICONDUCTOR DEVICE

(75) Inventors: Takeshi Kobayashi, Tochigi (JP); Hisao Sugoh, Tochigi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/757,388

(22) Filed: Jan. 15, 2004

(65) Prior Publication Data
US 2004/0147063 A1 Jul. 29, 2004

(30) Foreign Application Priority Data
Jan. 16, 2003 (JP) .............................. 2003-008349

(51) Int. Cl.
*H01L 23/48* (2006.01)
*H01L 23/52* (2006.01)
*H01L 29/40* (2006.01)

(52) U.S. Cl. .................. 257/781; 257/666; 257/690; 257/E23.043

(58) Field of Classification Search .................. 257/666, 257/787, 780, 781, 782, 784, 786, 696, 698, 257/730, 676, 667–668, 672, 674, 690, 692–693, 257/789, 773, E23.004, E23.043, E23.046, 257/E23.047, E23.048, E23.049, E23.05
See application file for complete search history.

(56) References Cited

U.S. PATENT DOCUMENTS

| | | | |
|---|---|---|---|
| 5,900,676 A * | 5/1999 | Kweon et al. | 257/787 |
| 6,072,239 A * | 6/2000 | Yoneda et al. | 257/730 |
| 6,191,494 B1 * | 2/2001 | Ooyama et al. | 257/796 |
| 6,329,711 B1 | 12/2001 | Kawahara et al. | |
| 6,339,261 B1 | 1/2002 | Yonemochi et al. | |
| 6,441,502 B2 * | 8/2002 | Yamada et al. | 257/786 |
| 6,759,597 B1 * | 7/2004 | Cutting et al. | 174/260 |
| 2002/0027265 A1 | 3/2002 | Yoneda et al. | |

FOREIGN PATENT DOCUMENTS

EP 0 645 952 A1 3/1995

(Continued)

OTHER PUBLICATIONS

Japanese Office Action with English translation, issued in Japanese Patent Application No. 2005-071274 dated Jul. 2, 2008.

*Primary Examiner*—Davienne Monbleau
*Assistant Examiner*—Dilinh P Nguyen
(74) *Attorney, Agent, or Firm*—McDermott Will & Emery LLP

(57) ABSTRACT

There is provided a lead frame which comprises: a lead frame body comprising a sheet-shaped body made of metal; a groove portion for forming a lead which is formed by a predetermined depth in a lead forming region on a surface of the lead frame body; and a lead portion formed so that the lead portion can protrude from the groove portion onto the surface of the lead frame body, the lead portion being made of material different from material of the lead frame body. A thin type semiconductor device is provided in which the above lead frame is used and after a chip is mounted, the lead frame body is removed by means of etching.

9 Claims, 11 Drawing Sheets

FOREIGN PATENT DOCUMENTS

| | | |
|---|---|---|
| EP | 0 977 259 A2 | 2/2000 |
| EP | 0 999 587 A2 | 5/2000 |
| JP | 56 148846 | 11/1981 |
| JP | 06 148661 | 5/1994 |
| JP | 09-162348 | 6/1997 |
| JP | 9-162348 | 6/1997 |
| JP | 10-313082 | 11/1998 |
| JP | 11 067838 | 3/1999 |
| JP | 2000-294690 | 10/2000 |
| JP | 2001-230345 | 8/2001 |
| JP | 2001-358254 | 12/2001 |
| WO | WO 95/26047 | 9/1995 |

* cited by examiner

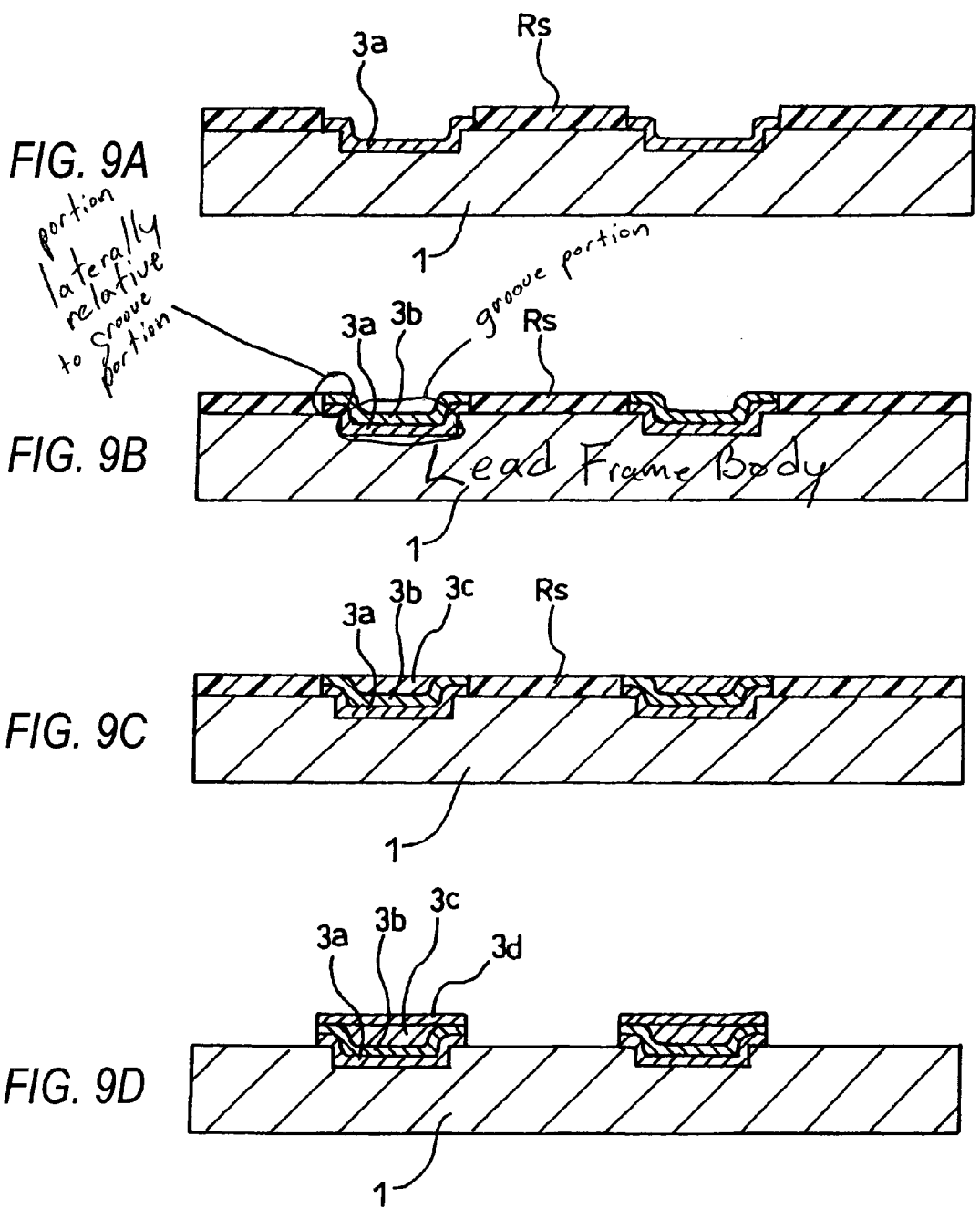

LEAD FRAME, METHOD OF MANUFACTURING THE SAME, SEMICONDUCTOR DEVICE USING LEAD FRAME AND METHOD OF MANUFACTURING SEMICONDUCTOR DEVICE

The present application is based on Japanese Patent Application No. 2003-008349, which is incorporated herein by reference.

BACKGROUND OF THE INVENTION

1. Field of the Invention

The present invention relates to a lead frame, a method of manufacturing the lead frame, a semiconductor device using the lead frame and a method of manufacturing the semiconductor device. More particularly, the present invention relates to the formation of an external terminal of a resin sealing type semiconductor device.

2. Description of the Related Art

Recently, electronic equipment such as a personal computer and cellular phone has been downsized. According to this tendency of downsizing electronic equipment, electronic parts are highly densely assembled. Therefore, in the field of a semiconductor device such as a diode and transistor, in order to reduce the assembling area, a face assembly type semiconductor device is widely used.

In this face assembly type semiconductor device, in order to reduce the manufacturing cost, concerning the form of a package, a resin sealing type semiconductor device is widely used because the material cost is low and the productivity is high.

For the object of reducing the size of a semiconductor device, the following technique is proposed. A lead frame, in which a protrusion is formed in a region that becomes a lead, is used, and a semiconductor chip is mounted on the lead frame and electrically connected. After the completion of a resin sealing, the lead frame is removed together with the resin by polishing from the reverse side while leaving this protrusion so that the thickness can be reduced, and then dicing is conducted so as to divide it to individual semiconductor devices.

As an example, the semiconductor device shown in FIGS. 11A to 11C is proposed. Concerning this semiconductor device, refer to Patent Document 1. This semiconductor device is formed as follows. A semiconductor chip is fixed to and electrically connected to a lead frame, and then resin sealing is conducted from the reverse side of the lead frame. Then, the semiconductor chip 72 is fixed onto the lead frame. A frame comprising the islands 61, 61A, which become electrodes used for an external connection, and also comprising a plurality of lead terminals 62, 63, 62A, 63A, which become the other electrodes used for an external connection of the semiconductor chip 72 fixed to the adjoining island, is fixed to the semiconductor chip 72 being attached with conductive paste on the islands of the plurality of lead frames arranged in the row direction by the connecting bar and electrically connected to the adjoining lead terminal. A resin layer is formed on the lead frame so that the semiconductor chip and the lead terminal can be covered and reverse faces of the island and the lead terminal can be exposed. The islands, to which the semiconductor chips are fixed, and the semiconductor chips are individually divided into individual pieces in a region surrounding the electrically connected lead terminal.

[Patent Document 1]

Unexamined Japanese Patent Publication No. Hei-10-313082

According to this technique, it is possible to downsize the semiconductor device. However, on the contact face of the resin sealing type semiconductor device with the printed board, that is, on the reverse side of the semiconductor integrated circuit device, since the resin face and the lead terminals, which become the external terminals, are on the same plane, even when a small deviation of the size is caused, it is impossible to positively connect with the circuit pattern on the printed board, which could cause an imperfect contact.

In order to protrude the lead terminals, it is necessary to provide a plating process in which the bumps (the protruding portions) are formed after the completion of dicing, which increases the man-hour in the manufacturing process.

The present invention has been accomplished in view of the above actual circumstances. It is an object of the present invention to provide a highly reliable thin type semiconductor device capable of being easily manufactured.

SUMMARY OF THE INVENTION

The present invention provides a lead frame comprising: a lead frame body comprising a sheet-shaped body made of metal; a groove portion for forming a lead which is formed by a predetermined depth in a lead forming region on a surface of the lead frame body; and a lead portion formed so that the lead portion can protrude from the groove portion onto the surface of the lead frame body, the lead portion being made of material different from material of the lead frame body.

According to the above constitution, the lead portion is formed protruding from the groove portion. Therefore, assembling can be conducted in such a manner that the lead portion protrudes from the sealing resin. Therefore, when a semiconductor device is assembled to a printed board, it is possible to provide the semiconductor device in which no imperfect contact is caused. Accordingly, it is possible to form a stable external terminal structure without providing a plating process after the completion of resin sealing.

This external terminal can be formed under the condition that it is electrically connected via the lead frame body. Therefore, when the external terminal is formed, it is possible to adopt a means of electrolytic plating in which the lead frame body is used as an electrode. Accordingly, the thickness can be controlled with high accuracy, and a highly reliable external terminal can be formed with high efficiency.

After the semiconductor chip is mounted on the lead portion, an electrical connection is conducted by means of wire bonding or direct bonding. Then, resin sealing is conducted, and the lead frame body is removed from the reverse face by means of etching. Due to the foregoing, it becomes possible to provide a highly reliable thin semiconductor device. To be specific, the thickness of the semiconductor device can be reduced to about three fourths of the thickness of the conventional semiconductor device.

In the case of mounting the semiconductor chip, the lead portion is fixed to the lead frame body. Therefore, no positional shift is caused, and bonding can be positively performed with high reliability. Further, since the device is positively fixed by means of resin sealing and the lead frame is removed from the reverse face, the semiconductor device is not deformed.

Further, after the completion of resin sealing, dicing is conducted so that it can be divided into individual semiconductor devices. In this case, the lead portion can be made not to exist in the dicing region. Accordingly, in the case of dicing, it is not necessary for a cutting blade to cut off the lead portion. Accordingly, abrasion of the cutting blade can be reduced and the life of the cutting blade can be extended.

Since the lead is guided out only from a principal plane of the sealing resin and not guided out from the side of the sealing resin, there is no possibility that moisture gets into the sealing resin from the atmospheric air via the lead guiding portion. Accordingly, the reliability can be enhanced.

Further, it is possible to freely design the profile of the cross section of the lead portion according to the profile of the cross section of the groove portion. Accordingly, a highly dense and accurate lead portion pattern can be easily formed.

The present invention provides a lead frame, the lead including: a first conductor layer formed in the groove portion; a second conductor layer formed on the first conductor layer; and a third conductor layer formed on the second conductor layer, wherein the first conductor layer is assembled to an assembling member, and the third conductor layer is assembled to a bonding pad of a semiconductor chip.

According to the above constitution, it is preferable that the lead comprises a three-layer-structure and made of material corresponding to a member to be connected. Further, it is preferable that the main body located at the center is made of an inexpensive conductive material.

The present invention provides a lead frame, in which the first conductor layer covers the entire inner wall of the groove portion.

According to the above constitution, a semiconductor device can be formed with this lead frame in such a manner that the lead portion exposed from the sealing resin comprises only the first conductor layer. Accordingly, when the first conductor layer is made of stable metal such as gold capable of easily forming an alloy together with solder, a stable external terminal structure can be formed without conducting a plating process after the completion of sealing.

In this case, only the first conductor layer may be made of stable material which is difficult to be oxidized, and the second conductor layer may be made of inexpensive metal of low resistance. The first and the third conductor layer may be made of material which can be easily joined by solder. The third conductor layer may be made of the same material as the material of the second conductor layer.

It is preferable that the first conductor layer covers the entire inner wall of the groove portion and also covers a portion of the flat plane in the periphery of the groove portion. Due to the foregoing, it is possible to positively prevent the second conductor layer from being exposed. Therefore, it is possible to form a highly reliable semiconductor device.

In a lead frame of the present invention, an interface of the first and the second conductor layer is located above the surface of the lead frame body.

According to the above constitution, after the completion of assembling, the second conductor layer is perfectly sealed with the sealing resin, so that the second conductor layer can not be exposed to the surface. Therefore, in the same manner as that of the above lead frame, a stable lead frame of long life can be provided.

In a lead frame of the present invention, the lead includes a barrier layer for suppressing a reaction between the lead frame body and the first conductor layer, the barrier layer being provided between the first conductor layer and the groove portion.

According to the above constitution, since the barrier layer made of nickel or titanium is existing, an interface reaction is caused between the first conductor layer and the lead frame body by heat generated in the bonding process, and the first conductor layer can be prevented from deteriorating. This barrier layer may be formed thin. Further, this barrier layer may be finally removed.

In a lead frame of the present invention, the first conductor layer is made of metal capable of forming an alloy together with solder.

According to a semiconductor device to which the above lead frame is assembled, bonding can be appropriately performed when the semiconductor device is assembled to a printed board.

In a lead frame of the present invention, the third conductor layer is made of metal, the wire bonding property of which is high.

According to the above constitution, when the third conductor layer is made of metal such as gold, the wire bonding property of which is high, the semiconductor chip can be easily assembled.

In a lead frame of the present invention, the third conductor layer is made of metal having a high bonding property when the metal is bonded to a bonding pad of a semiconductor chip.

According to the above constitution, even when a semiconductor chip is mounted by means of direct bonding, assembling can be easily conducted.

In a lead frame of the present invention, the film thickness of the first and the second conductor layer is 0.5 to 2 μm.

According to the above constitution, the entire thickness can be sufficiently decreased. Further, the film thickness of the second conductor layer can be sufficiently increased. Therefore, it is possible to compose a semiconductor device, the entire thickness of which is sufficiently small, and the resistance of the external terminal of which is low.

In a lead frame of the present invention, the first conductor layer comprises a gold layer.

According to the above constitution, it is possible to compose a stable external terminal of low resistance, capable of easily forming an alloy with solder.

In a lead frame of the present invention, the third conductor layer comprises a gold layer.

According to the above constitution, it is possible to compose a highly reliable external terminal, the connecting property with the semiconductor chip of which is excellent.

In a lead frame of the present invention, the second conductor layer comprises a metallic layer, the primary component of which is nickel.

According to the above constitution, it is possible to form a lead of low resistance, the adhesion property to gold of which is high.

In this case, when the first conductor layer is made of stable metal such as gold capable of easily forming an alloy together with solder, a stable external terminal structure can be formed without conducting a plating process after the completion of sealing.

In this case, only the first conductor layer may be made of stable material which is difficult to be oxidized, and the second conductor layer may be made of inexpensive metal of low resistance. The first and the third conductor layer may be made of material which can be easily joined by solder. The third conductor layer may be made of the same material as the material of the second conductor layer.

A method of manufacturing a lead frame of the present invention comprises: a step of forming a resist pattern on a surface of the lead frame body comprising a sheet-shaped body made of metal so that a lead forming region can be opened; a step of forming a groove portion for forming a lead of a predetermined depth in the lead forming region when etching is conducted while the resist pattern is being used as a mask; and a step of forming a lead portion, the material of which is different from the material of the lead frame body, so that the lead portion can protrude from the groove portion onto a surface of the lead frame body.

According to the above constitution, it is possible to easily form a highly accurate, reliable lead frame. Further, when the process of photolithography is used, it is possible to form a fine and highly accurate lead.

In a method of manufacturing a lead frame of the present invention, the step of forming the lead portion includes an electrolytic plating step of forming a metallic film on an inner wall of the groove portion while the resist pattern is being used as a mask.

According to the above constitution, electrolytic plating can be conducted while the lead frame body is being used as an electrode. Therefore, a lead frame of low resistance can be easily formed in a short period of time. Since electrolytic plating is conducted by using the resist pattern, which was used for forming the groove portion, as a mask, the metallic film can be formed on an inner wall of the groove portion. Due to the foregoing, it is possible to form an external terminal having a layer structure in which the entire external terminal is covered with an outermost metallic film.

A method of manufacturing a lead frame of the present invention further comprises a step of shrinking the resist pattern after the groove portion is formed while the resist pattern is being used as a mask so that a surface of the lead frame body round the groove portion can be somewhat exposed.

According to the above structure, it is possible to expose a circumferential edge of the groove portion. Therefore, the conductor layer can be formed in such a manner that the conductor layer rises from the inner wall of the groove portion to the flat portion.

A method of manufacturing a lead frame of the present invention, the step of forming the lead includes: a step of forming a first conductor layer in the groove portion and in its periphery exposed from the resist pattern which has shrunk in the shrinking step; a step of forming a second conductor layer, which is laminated so that an end edge of the first conductor layer can be left, on the first conductor layer; and a step of forming a third conductor layer on the second conductor layer.

According to the above constitution, the first conductor layer is formed in such a manner that it rises from the inside of the groove portion to the flat portion and then the second and the third layer are laminated so that an end edge portion of the first conductor layer can be left. Accordingly, an external terminal structure in which the entire surface of the external terminal is covered with the first conductor layer can be easily formed.

In a method of manufacturing a lead frame of the present invention, the step of forming the second conductor layer includes: a step of forming a thin conductive film on the first conductor layer; and a step of conducting etch-back on the thin conductive film by means of anisotropic etching.

After the first conductor layer has been formed on the inner wall of the groove portion, the second conductor layer is formed and the process of etch-back is conducted. In this way, it is possible to form a structure in which the entire second conductor layer is covered with the first conductor layer.

In a method of manufacturing a lead frame of the present invention, the step of forming the lead includes a step of forming the first to the third conductor layer in the groove portion in order, and an interface of the first and the second conductor layer is located above the surface of the lead frame body.

According to the above constitution, it is possible to form a lead frame in which a semiconductor device surface exposed from the sealing resin used as an external terminal is covered with the first conductor layer.

In a method of manufacturing a lead frame of the present invention, the step of forming the lead includes a step of forming a barrier layer for suppressing a reaction of the lead frame body and the first conductor layer, between the first conductor layer and the groove portion.

According to the above method, the barrier layer can be easily formed by a series of plating process. Therefore, manufacturing can be easily performed.

In a method of manufacturing a lead frame of the present invention, the step of forming the groove portion includes an anisotropic etching step for forming a groove, the cross section of which is a rectangle of 0.5 to 2.5 μm depth.

According to the above method, it is possible to form a fine lead, the pattern accuracy of which is high. When the depth of the rectangular groove is smaller than 0.5 μm, it is impossible to sufficiently reduce the resistance. When the depth of the rectangular groove exceeds 2.5 μm, it become difficult to reduce the thickness of the semiconductor device.

A semiconductor device of the present invention comprises: a semiconductor chip; a lead portion connected to the semiconductor chip; and a piece of sealing resin, wherein a portion of the reverse face of the lead portion protrudes from a principal plane of the piece of sealing resin, and the lead portion is a thin film formed from the outer face side to the inner face side.

According to the above constitution, an outer surface of the lead portion, which becomes an assembling face to be assembled to an assembling member such as a printed board, is arranged on the base side in the process of film forming. Therefore, the surface can be maintained in a state in which the orientation is excellent and the precision is high. Accordingly, it is possible to provide a highly reliable connection.

In a semiconductor device of the present invention, the lead includes: a first conductor layer; a second conductor layer laminated inside the first conductor layer; and a third conductor layer formed inside the second conductor layer, wherein an entire surface of the lead, which is exposed from the sealing resin, is covered with the first conductor layer.

According to the above constitution, the lead portion exposed from the sealing resin is only the first conductor layer. Therefore, it is possible to form a stable external terminal structure without conducting a plating process after the completion of sealing.

In a semiconductor device of the present invention, an interface of the first and the second conductor layer is located inside the surface of the sealing resin.

According to the above constitution, after the completion of assembling, the second conductor layer is perfectly sealed with the sealing resin, so that it can not be exposed onto the surface. Therefore, in the same manner as that of the aforementioned semiconductor device, a stable lead frame of long life can be provided.

In a semiconductor device of the present invention, the first conductor layer is made of metal capable of forming an alloy together with solder.

In a semiconductor device of the present invention, the third conductor layer is made of metal which can be bonded by means of wire-bonding.

In a semiconductor device of the present invention, the third conductor layer is made of metal which can be bonded to the bonding pads of the semiconductor chip.

In a semiconductor device of the present invention, the film thickness of the first and the second conductor layer is 0.5 to 2 μm.

In a semiconductor device of the present invention, the first conductor layer comprises a gold layer.

In a semiconductor device of the present invention, the third conductor layer comprises a gold layer.

In a semiconductor device of the present invention, the second conductor layer comprises a metallic layer, the primary component of which is nickel.

The present invention provides a method of manufacturing a semiconductor device, in which a lead frame is prepared, the lead frame including a lead frame body comprising a sheet-shaped body made of metal and also including a groove portion for forming a lead, the groove portion being formed in a lead forming region on a surface of the lead frame body by a predetermined depth, and also including a lead portion formed so that the lead portion can protrude from the groove portion onto a surface of the lead frame body, the lead portion being made of material different from the lead frame body, the method of manufacturing a semiconductor device comprising: a semiconductor chip mounting step of mounting a semiconductor chip on a lead frame and electrically connecting the semiconductor chip to the lead portion; a resin sealing step of covering the semiconductor chip with the sealing resin; a step of removing the lead frame body by means of etching; and a dicing step of dicing into individual semiconductor devices.

According to the above constitution, in the case of mounting a semiconductor chip, the lead portion is fixed to the lead frame body. Therefore, a positional deviation is not caused and bonding can be performed with high reliability. After the lead portion has been positively fixed by means of resin sealing, the lead frame body is removed from the reverse side. Therefore, no deformation is caused in the semiconductor device.

Since the lead portion is formed protruding from the groove portion, the lead portion protruding from the sealing resin is not subjected to a plating process after resin sealing, and a stable external terminal structure can be formed. Therefore, the semiconductor device can be assembled to a printed board without the occurrence of an imperfect contact.

A highly reliable thin semiconductor device can be easily provided.

After the completion of resin sealing, dicing is conducted so that the semiconductor device can be divided into individual pieces. Since it is possible to make the lead portion not exist in the dicing region, and it is unnecessary that a cutting blade cuts the lead portion at the time of dicing. Therefore, abrasion of the cutting blade can be reduced and the blade life can be extended.

In addition to that, the profile of the cross-section of the lead portion can be freely designed according to the profile of the cross-section of the groove portion. Therefore, a highly dense, accurate semiconductor device can be easily formed.

In a method of manufacturing a semiconductor device of the present invention, the lead includes: a first conductor layer formed in the groove portion; a second conductor layer laminated on the first conductor layer; and a third conductor layer formed on the second conductor layer, wherein the first conductor layer is assembled to an assembling member such as a printed board, and the third conductor layer is assembled to a bonding pad of the semiconductor chip.

According to the above constitution, a highly reliable thin type semiconductor device can be easily provided at low cost.

In a method of manufacturing a semiconductor device of the present invention, the lead is formed so that it covers an entire inner wall of the groove portion.

According to the above constitution, a more highly reliable thin type semiconductor device can be formed without an increase in the man-day.

In a method of manufacturing a semiconductor device of the present invention, an interface of the first and the second conductor layer is located above the surface of the lead frame body.

According to the above constitution, a highly reliable thin type semiconductor device can be formed without an increase in the man-day.

In a method of manufacturing a semiconductor device of the present invention, the lead includes a barrier layer for suppressing a reaction between the lead frame body and the first conductor layer, the barrier layer being provided between the first conductor layer and the groove portion, the method of manufacturing a semiconductor device further comprising a step of removing the barrier layer by means of etching after the completion of resin sealing.

According to the above constitution, it is possible to prevent the first conductor layer from deteriorating by an interface reaction caused by heat generated in the bonding process.

BRIEF DESCRIPTION OF THE DRAWINGS

In the accompanying drawings:

FIG. 1B is a cross-sectional view taken on line A-A, FIG. 1C is a lower view and FIG. 1D is a cross-sectional view taken on line B-B;

FIGS. 9A to 9D are process drawings of manufacturing a lead frame of the second embodiment of the present invention;

DETAILED DESCRIPTION OF THE PREFERRED EMBODIMENTS

Figure 1A:
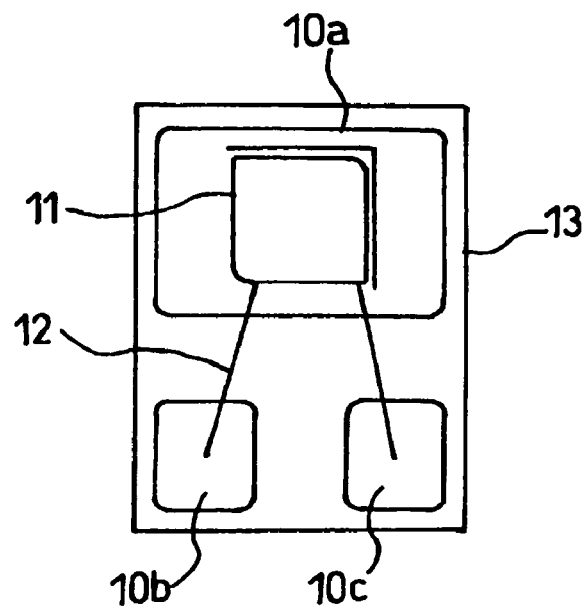
FIGS. 1A to 1D are views showing a semiconductor device of the first embodiment of the present invention, FIG. 1A an upper view.

Next, embodiments of the present invention will be explained in detail referring to the drawings.

First Embodiment

Figure 1B:
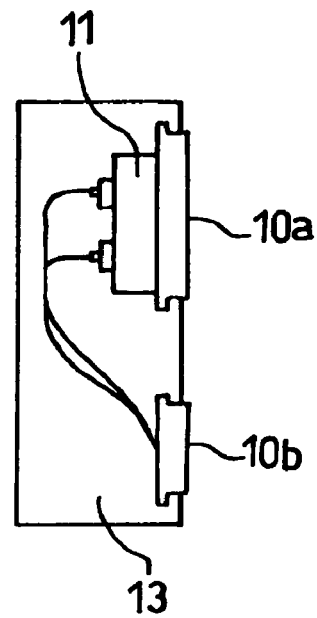
Figure 1C:
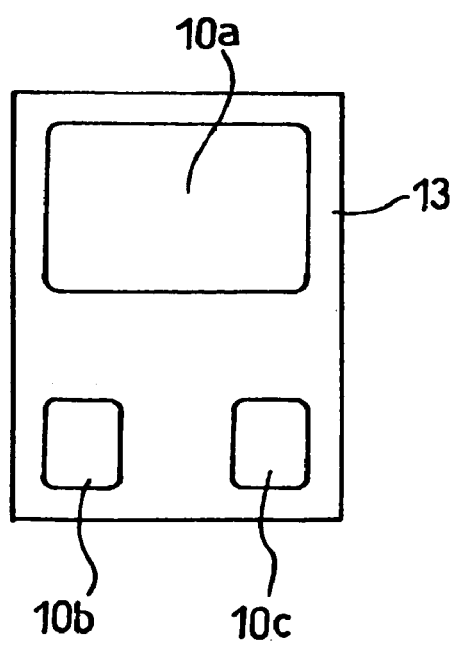
Figure 1D:
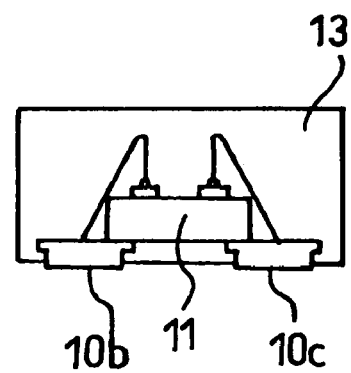

FIGS. 1A to 1C are respectively an upper view, a cross-sectional view taken on line A-A, a lower view and a cross-sectional view taken on line B-B showing a semiconductor device of the first embodiment of the present invention. As shown in the drawings, this semiconductor device is a face assembly type semiconductor device, which is formed as follows. The semiconductor chip 11 composing a bipolar transistor is set on the die pad 10a, and the pad connected to the collector and the pad connected to the emitter are respectively electrically connected to the lead terminals 10b, 10c via the bonding wires 12 and sealed with resin. From the reverse face of this sealing resin, the die pad 10a composing the base terminal and the lead terminals 10b, 10c composing the emitter terminal and the collector terminal are somewhat protruded, so that a face assembly type semiconductor device can be formed.

Figure 2:
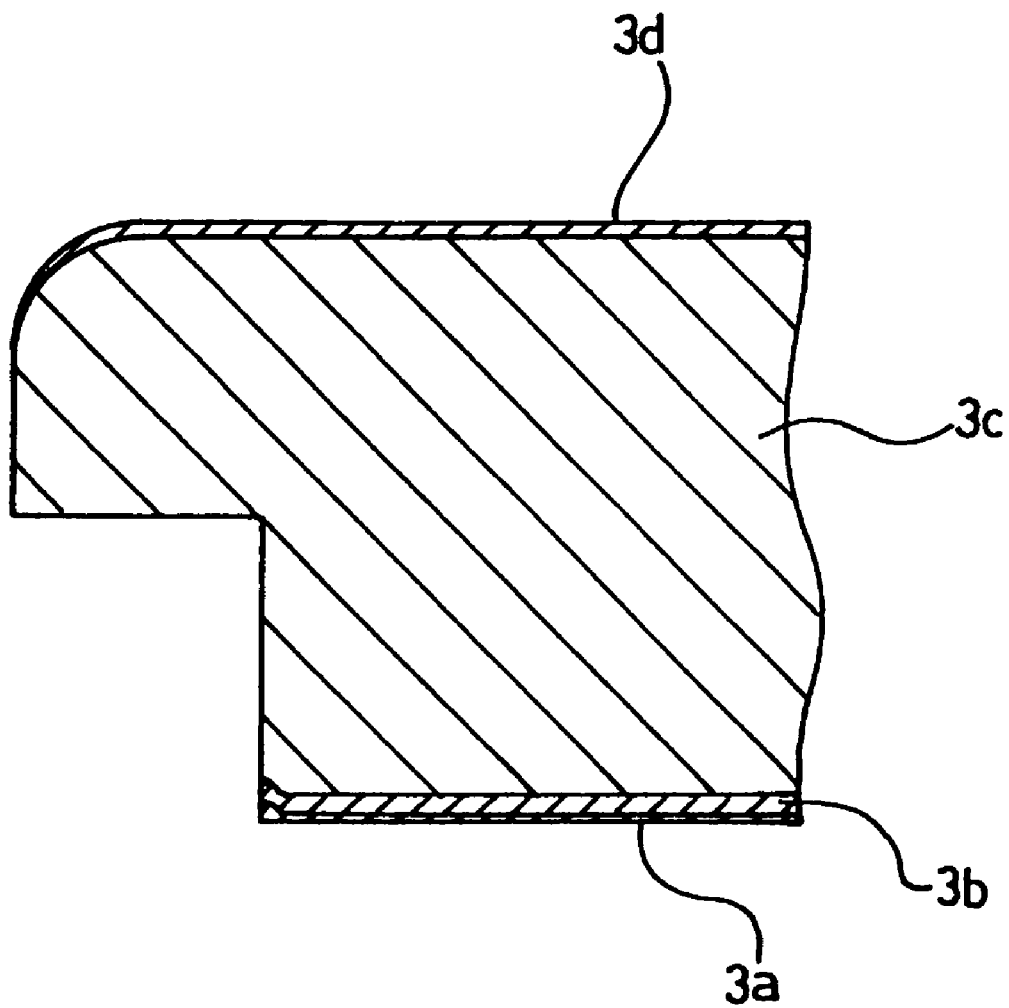
FIG. 2 is an enlarged cross-sectional view of a primary portion of the lead frame of the first embodiment of the present invention.

The die pad and the lead terminal comprise a three layer structure. As shown in FIG. 2 which is an enlarged view of the primary portion, the die pad and the lead terminal include: a barrier layer 3a comprising a nickel layer, the film thickness of which is 0.0005 mm; a first conductor layer 3b comprising a gold layer, the film thickness of which is 0.0015 mm, formed on this barrier layer 3a; a second conductor layer 3c comprising a nickel layer, the film thickness of which is 0.030 mm, laminated on the first conductor layer; and a third conductor layer 3d comprising a gold layer, the film thickness of which is 0.0007 mm, formed on the second conductor layer.

Figure 3:
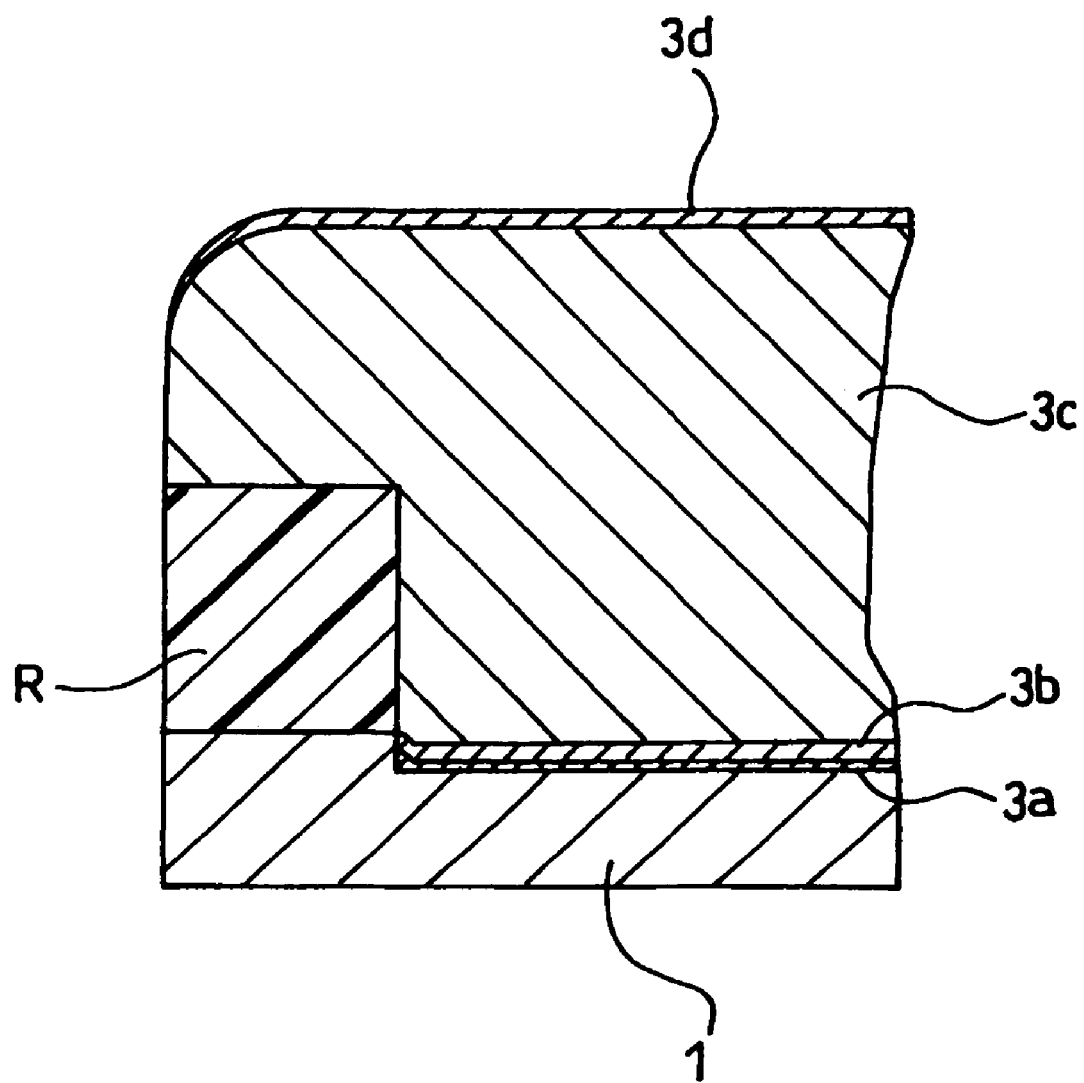
FIG. 3 is a conceptional schematic illustration of a semiconductor device of the first embodiment of the present invention.

As shown in FIG. 3 which is an enlarged view of the primary portion, the characteristics of this layer structure are described as follows. In the groove portion 2 of 0.008 mm thickness formed on the surface of a copper plate which is the main body 1 of the lead frame, the barrier layer 3a, the first conductor layer 3b, the second conductor layer 3c and the third conductor layer 3d are successively laminated in order, and the first conductor layer is formed so that it covers an inner wall of the groove portion 2 via the barrier layer 3a. This view shows a state before resist R is removed.

Next, a method of assembling this semiconductor device will be explained below.

First, a method of manufacturing this lead frame will be explained.

According to this method, the shallow groove portion 2 is formed on a surface of the lead frame body, which comprises a plate-shaped body (copper plate) made of metal, by means of photolithography. Then, the lead portion comprising a metallic layer of the four-layer structure is formed in this groove portion 2 by means of electrolytic plating so that the lead portion can protrude from the groove onto the surface of the lead frame body.

Figure 4A:
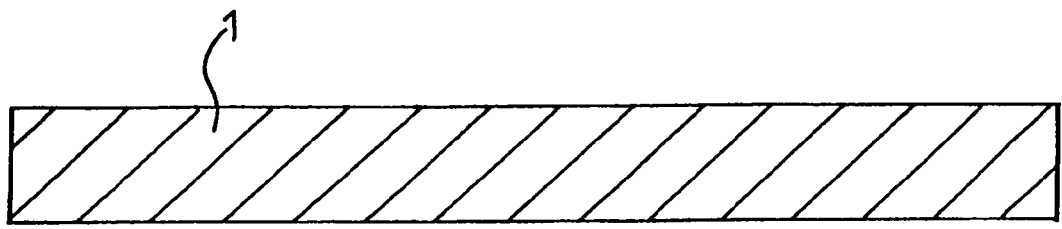
FIGS. 4A to 4C are process drawings of manufacturing a lead frame of the first embodiment of the present invention.

As shown in FIG. 4A, the lead frame body 1 comprising a copper plate is prepared.

Figure 4B:
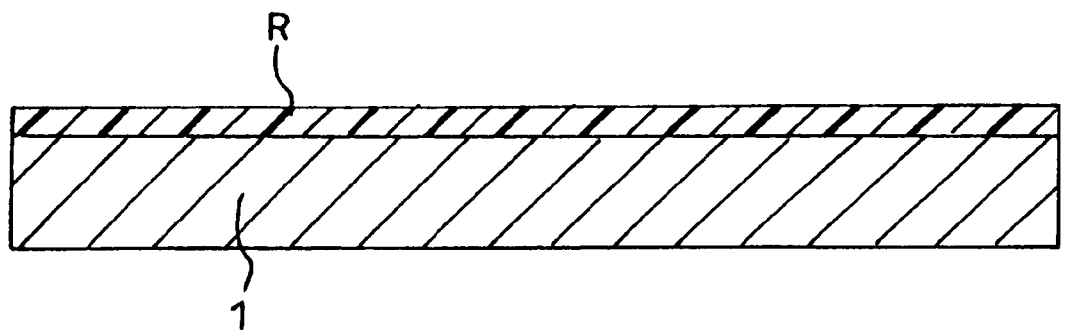

As shown in FIG. 4B, resist R is coated.

Figure 4C:
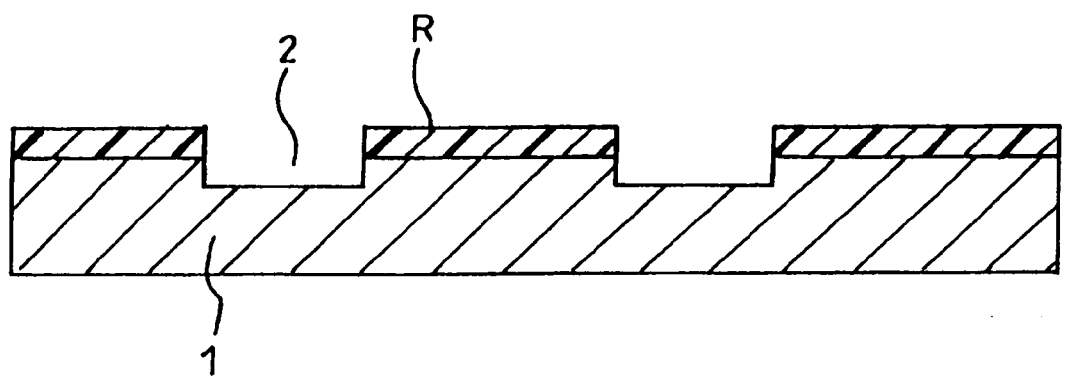

After that, as shown in FIG. 4C, patterning is conducted on resist R by means of photolithography. While this resist R is being used as a mask, anisotropic etching is conducted so as to form the shallow groove 2 of 0.5 to 2.5 μm thickness, the cross-section of which is rectangular.

Figure 5A:
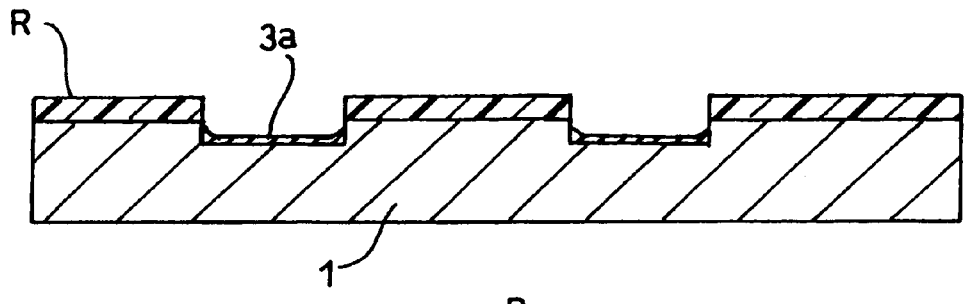
FIGS. 5A to 5D are process drawings of manufacturing a lead frame of the first embodiment of the present invention.

After that, as shown in FIG. 5A, while resist R is being left as it is, the lead frame body 1 is dipped in a plating solution which is a water solution of nickel sulfonate, and the nickel layer 3a, which is a barrier layer, is formed by means of electrolytic plating.

Figure 5B:
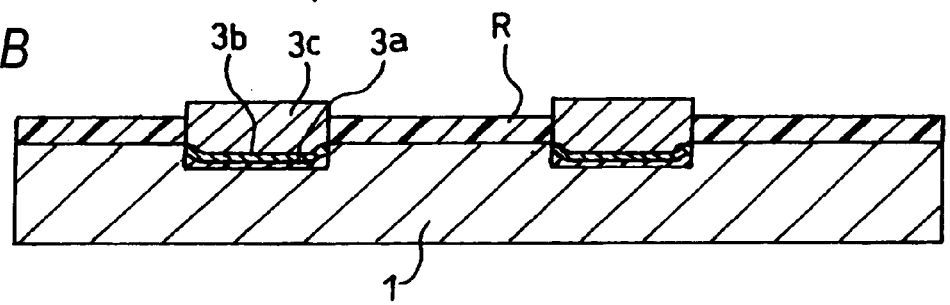
Figure 5C:
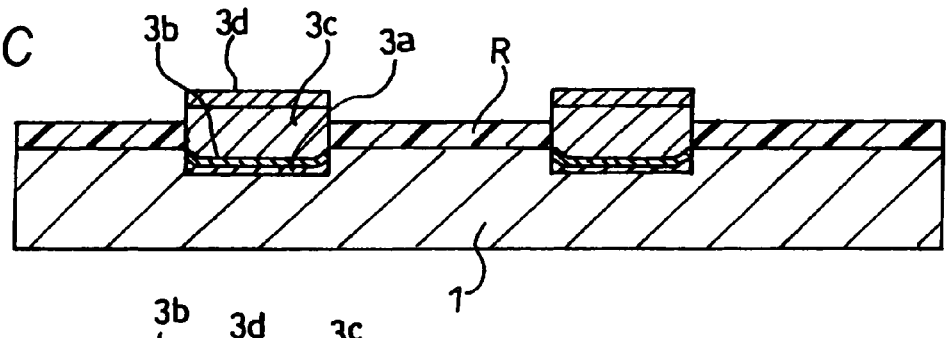

Then, as shown in FIG. 5B, a gold layer, which is the first conductor layer 3b, and a nickel layer, which is the second conductor layer 3c, are successively laminated by means of electrolytic plating. At this time, a nickel layer, which is the barrier layer 3a, and a gold layer, which is the first conductor layer 3b, are formed on the entire inner wall of the groove portion 2.

Further, a gold layer, which is the third conductor layer 3d, is formed.

Figure 5D:
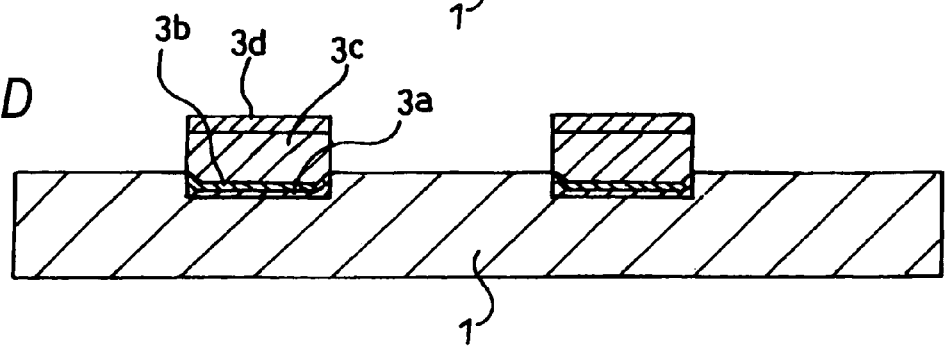

Finally, as shown in FIG. 5D, resist R is removed, and the lead frame of the first embodiment of the present invention is formed.

Next, explanations will be made into a method of manufacturing a bipolar transistor in which this lead frame is used.

Figure 6A:
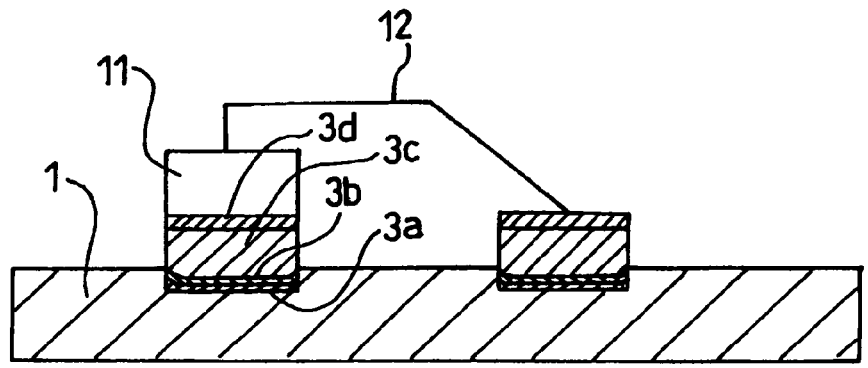
FIGS. 6A to 6C are process drawings of manufacturing a semiconductor device of the first embodiment of the present invention.

First, as shown in FIG. 6A, a reverse face of the semiconductor chip 11 is mounted on and fixed to the die pad 10a of the lead frame shown in FIGS. 4A to 5D. Then, the semiconductor chip and the lead terminal are electrically connected to each other by the bonding wire 12.

Figure 6B:
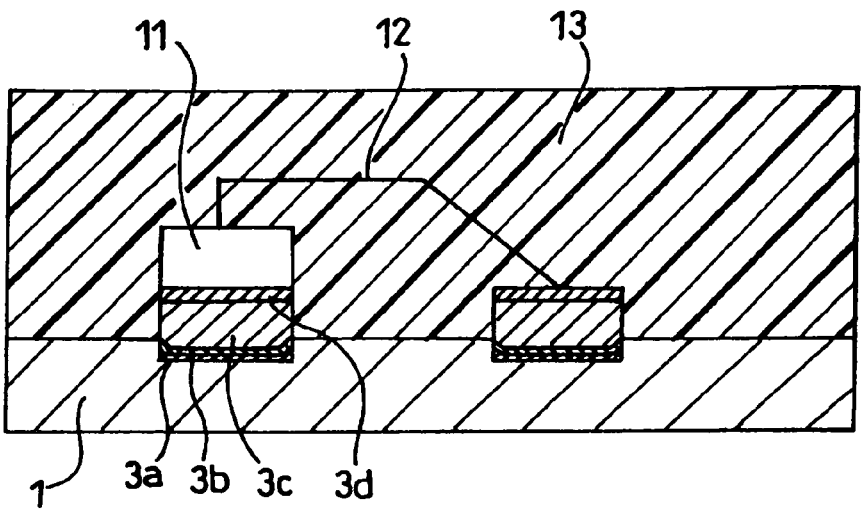

After that, as shown in FIG. 6B, resin sealing is conducted with epoxy resin. In this way, the semiconductor device fixed by the sealing resin 13 is formed.

Figure 6C:
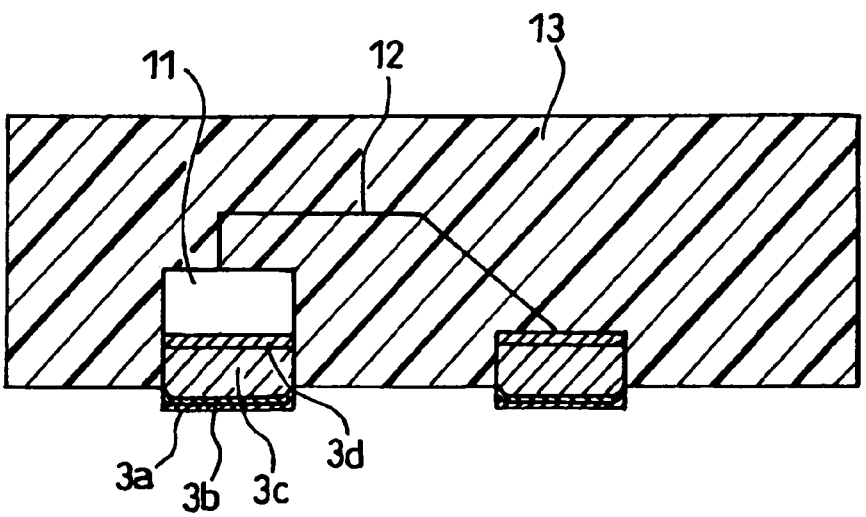

Finally, as shown in FIG. 6C, the lead frame body 1 comprising a copper plate is removed by means of etching. In this way, the semiconductor device, the barrier layer 3a and the first conductor layer 3b of which are exposed from the sealing resin 13, can be obtained.

Figure 7A:
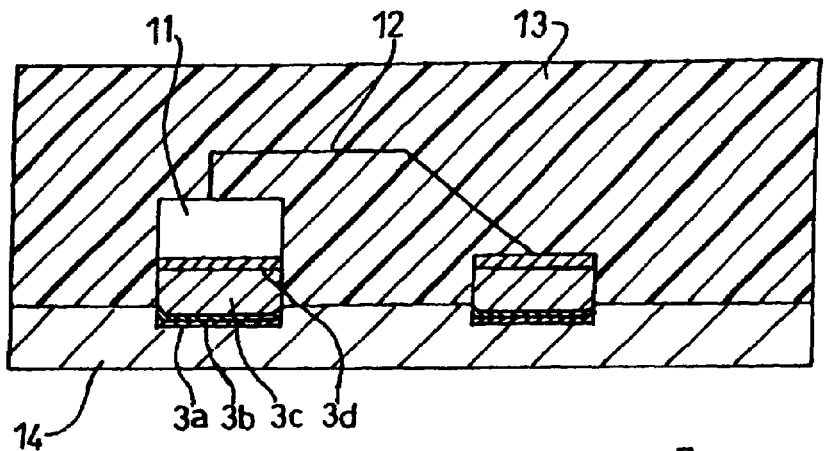
FIGS. 7A to 7C are process drawings of manufacturing a semiconductor device of the first embodiment of the present invention.

Then, the adhesive tape 14 is stuck onto an exposed side of the lead terminal 3 (3a, 3b, 3c) as shown in FIG. 7A.

Figure 7B:
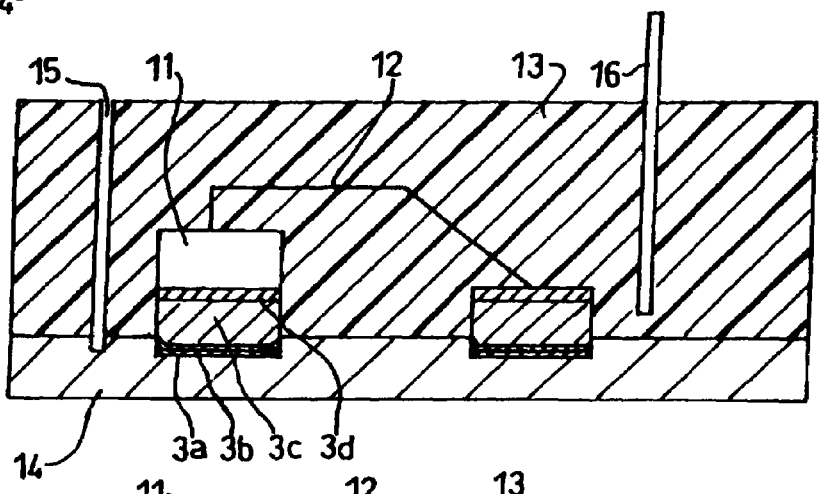

After that, as shown in FIG. 7B, the dicing groove 15 is formed by means of cutting from one side, on which the adhesive tape 14 is not stuck, to the other side, on which the adhesive tape 14 is stuck, with the dicing blade 16, so that the semiconductor device can be separated.

Figure 7C:
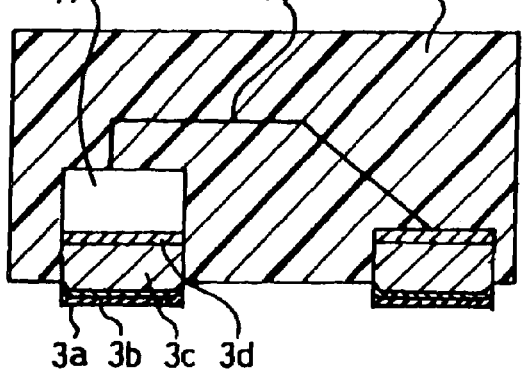

As shown in FIG. 7C, when the semiconductor device is assembled to a printed board, the semiconductor device is separated from this adhesive tape 14 and assembled.

In this connection, after the completion of bonding, the barrier layer may be removed by etching together with the lead frame body after resin sealing has been completed.

According to the above structure, since the lead portion protrudes from the sealing resin surface, assembling can be stably performed so that the lead portion can protrude from the sealing resin. Accordingly, it is possible to provide a semiconductor device having no imperfect contact in the case of assembling the semiconductor device onto a printed board. As described above, according to the embodiment of the present invention, it is possible to compose a stable external terminal structure without conducting a plating process after the completion of resin sealing.

The semiconductor chip is mounted on the lead portion, and an electrical connection is conducted by means of wire bonding or direct bonding. Then, resin sealing is conducted and the lead frame body is removed by etching from the reverse face. Due to the foregoing, a thin type highly reliable semiconductor device can be provided. Therefore, the thickness of the semiconductor device can be reduced as small as possible. That is, the thickness of the semiconductor device can be reduced to about three fourths of the thickness of the conventional semiconductor device.

In the case of mounting the semiconductor chip, since the lead portion is fixed to the lead frame body, no positional shift is caused and bonding can be positively conducted with high reliability. After the semiconductor chip has been positively fixed by means of resin sealing, the lead frame body is removed from the reverse face. Therefore, no deformation is caused in the semiconductor device. Since the barrier layer is provided, even when the connecting portion is heated to a high temperature at the time of mounting the semiconductor element or wire bonding, the lead portion can be prevented from deteriorating. This barrier layer may be left as it is. Alternatively, this barrier layer may be finally removed by etching. In the case of etching, when etching is conducted after the completion of resin sealing, since the other portions are covered with the sealing resin, it may be dipped in the etching solution as it is. Therefore, the working property is very excellent.

After the completion of resin sealing, the semiconductor device is diced into individual semiconductor devices so that the semiconductor device can be divided into individual pieces. At this time, since no lead portion exists in the dicing region, it is unnecessary for the blade to cut the lead portion at the time of dicing. Therefore, abrasion is seldom caused in the blade, and life of the blade can be extended.

Since the lead portion is guided out only from the principal plane of the semiconductor device, no air gets into the semiconductor device from the portion where the lead portion is guided out. Therefore, it is possible to provide a highly reliable semiconductor device.

Further, the cross-sectional profile of the lead portion can be freely designed according to the cross-sectional profile of the groove portion. Accordingly, it is possible to form a highly accurate and highly dense lead portion pattern.

Since the lead portion exposed from the sealing resin of the semiconductor device comprises a gold layer, a stable external terminal structure can be formed without conducting a plating process after the completion of resin sealing.

In this connection, the first conductor layer may be made of metal such as gold, tin and palladium capable of forming an alloy together with solder.

Since the barrier layer is existing, it is possible to prevent the first conductor layer and the lead frame body from deteriorating by an interface reaction caused by heat generated in the bonding process. This barrier layer may be made of nickel, titanium or tungsten. The barrier layer may be formed thin. Alternatively, the barrier layer may be finally removed by etching. In the case of eutectic solder of gold-silicon, it is necessary to conduct bonding at a high temperature of about 400° C. On the other hand, in the case of eutectic solder such as gold-tin or gold-germanium, which can be bonded at a relatively low temperature of about 350° C., it is unnecessary to provide the barrier layer.

In the lead frame of the present invention, when the first conductor layer is made of metal such as gold which can easily form an alloy with solder, bonding can be excellently conducted when the semiconductor device is assembled to a printer board.

When the third conductor layer is made of metal, the wire bonding property of which is high, the semiconductor chip can be easily assembled.

This lead frame can be applied to both wire bonding and direct bonding. The third conductor layer may be made of metal, the bonding property with the bonding pad of the semiconductor chip of which is high.

The first and the third conductor layer are provided for enhancing the bonding property and the assembling property. Therefore, it is preferable that the first and the third conductor layer are formed to be sufficiently thin.

Due to the foregoing, the entire thickness can be sufficiently reduced and further the film thickness of the second conductor layer can be made to be sufficiently thick. Accordingly, it is possible to compose a semiconductor device, the entire thickness of which is sufficiently small, having an external terminal of low resistance.

In this connection, in the first embodiment described above, the barrier layer is provided. However, it is possible to adopt a structure in which no barrier layer is provided and the lead portion comprises a three-layer structure.

According to the method of manufacturing a lead frame of this embodiment, it is possible to form a highly accurate and reliable lead frame through the process of photolithography.

Since the first conductor layer is formed on the entire inner wall of the groove portion of the lead frame body via the barrier layer, the second conductor layer is not exposed from the sealing resin after the completion of resin sealing. As shown in the Second Embodiment described hereinafter, it is preferable that an interface of the first and the second conductor layers is located above the upper face of the groove portion. In other words, it is preferable that the interface of the first and the second conductor layers is located above the upper face of the lead frame body. However, even when the interface of the first and the second conductor layer is located on a lower layer of the upper face of the groove portion, no problems are caused if the second layer is made of material which is difficult to be oxidized.

According to the method of manufacturing a lead frame of the present invention, in the process of forming the lead portion, a metallic film is formed on the inner wall of the groove portion while the resist pattern is being used as a mask. Therefore, the lead of low resistance can be easily formed in a short period of time.

Since etching is conducted while the resist pattern used for forming the groove portion is being used as a mask, it is possible to form a conductive film such as a metallic film along the inner wall of the groove portion. Therefore, an external terminal can be easily formed, the layer structure of which is formed in such a manner that the entire device is covered with the outermost conductive film.

Second Embodiment

Next, the second embodiment of the present invention will be explained below.

In the semiconductor device of this embodiment, the external terminal structure is formed as follows. As show in FIG. 10, after the first conductor layers 3c, 3d have been formed in such a manner that the first conductor layers 3c, 3d rise from the inside of the groove portion to the flat portion, the second and the third conductor layer are laminated on each other so that an end edge portion of the first conductor layer 3b can be left, and the entire surface of the external terminal composes the external terminal structure covered with the first conductor layer.

In this case, there is provided a nickel layer, which is used as the barrier layer 3a, on the outer layer of the first conductor layer 3b.

As described above, the conductor layer is formed in such a manner that the circumferential edge of the groove portion is exposed and made to rise from the inner wall of the groove portion to the flat portion. Accordingly, in this constitution, the entire surface of the lead terminal is covered with the first conductor layer, and the second conductor layer 3c comprising a nickel layer is embedded in the resin, so that the second conductor layer 3c is not exposed to the outside air.

In the method of manufacturing the lead frame used for the semiconductor device, when the lead portion is formed, an electrolytic plating process is used in which a metallic film is formed on the inner wall of the groove portion while the resist pattern is being used as a mask.

According to this method, electrolytic plating is conducted while the resist pattern used for forming the groove portion is being used as a mask. Therefore, it is possible to form a conductive film such as a metallic film on the inner wall of the groove portion, and an external terminal having a layer structure, in which the entire device is covered with the outermost conductive film, is formed.

Figure 10:
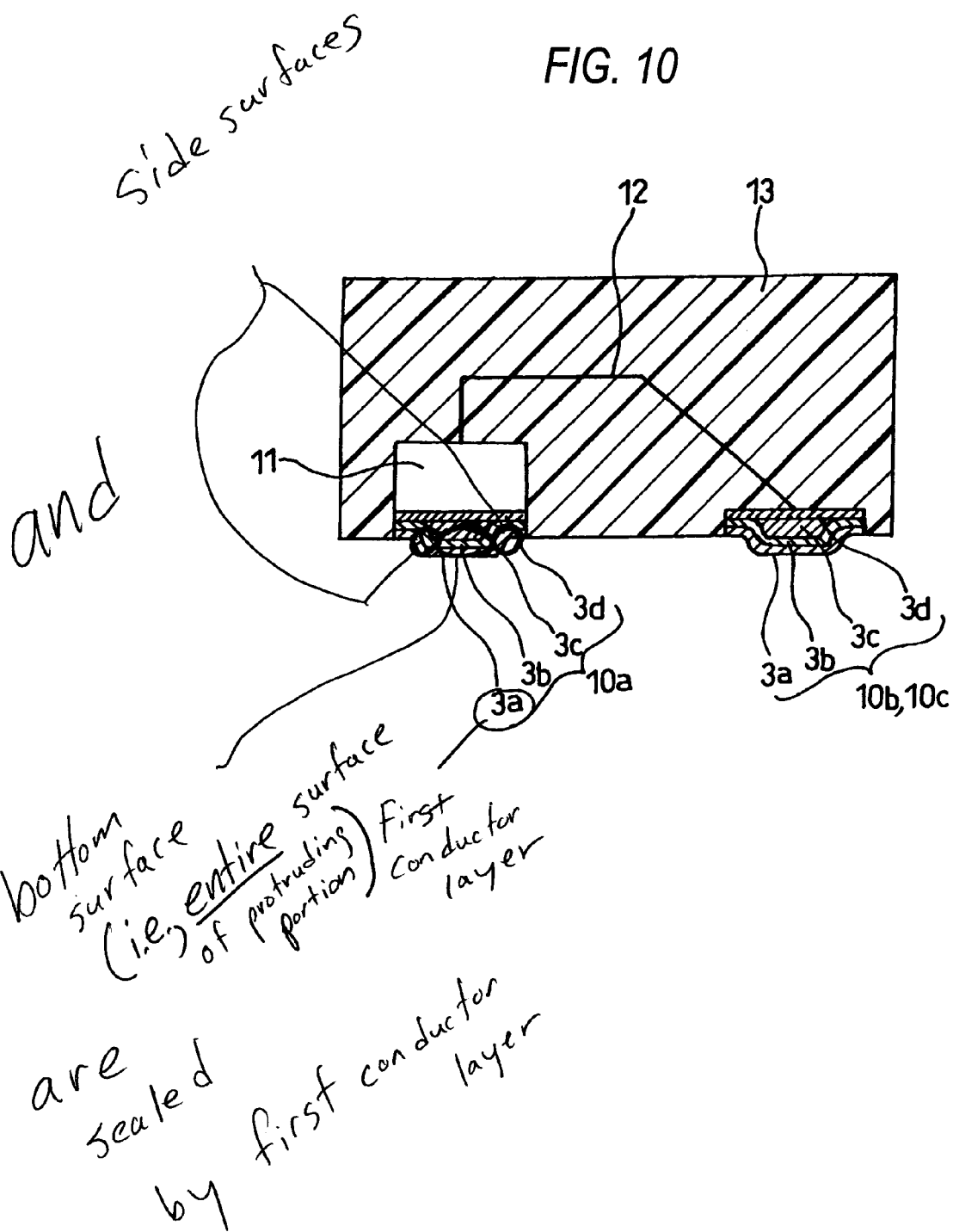
FIG. 10 is a view showing a semiconductor device formed in the second embodiment of the present invention.
Figure 11A:
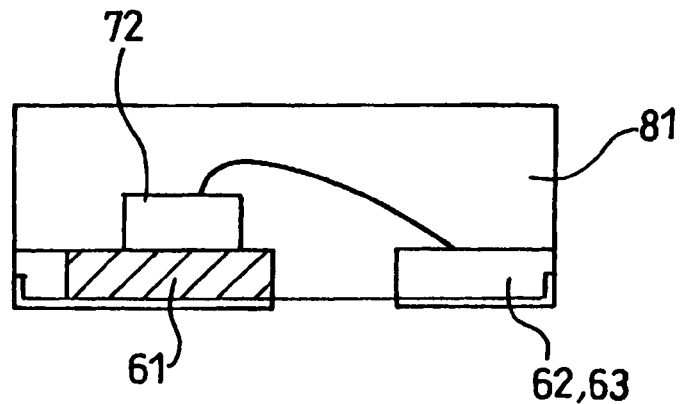
FIGS. 11A to 11C is a view showing a conventional semiconductor device.
Figure 11B:
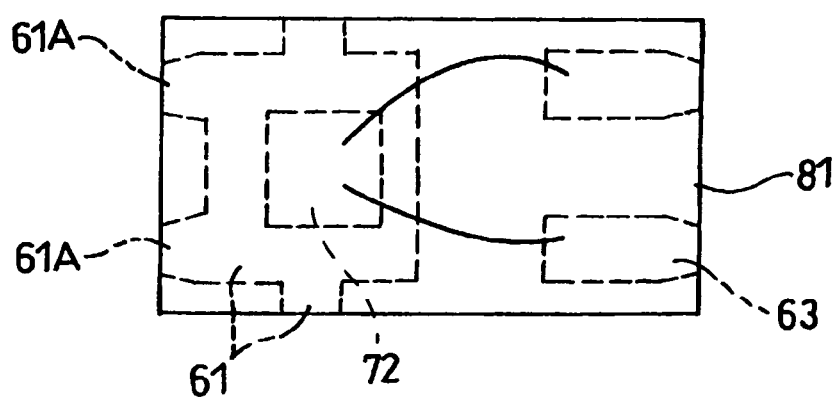
Figure 11C:
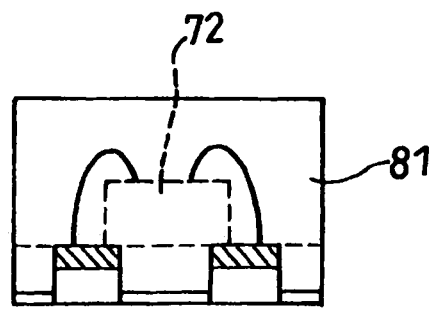

FIGS. 8 and 9 are views showing a lead frame of the second embodiment of the present invention, and FIG. 10 is a view showing a semiconductor device comprising this lead frame.

This method comprises a step of shrinking a resist pattern after a groove portion is formed while the resist pattern is being used as a mask so that a surface of the lead frame body round the groove portion can be somewhat exposed.

Figure 8A:
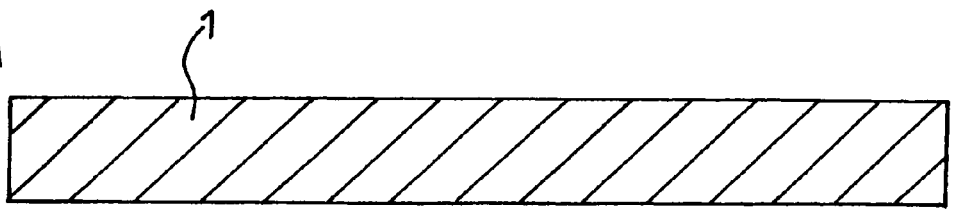
FIGS. 8A to 8D are process drawings of manufacturing a lead frame of the second embodiment of the present invention.
Figure 8B:
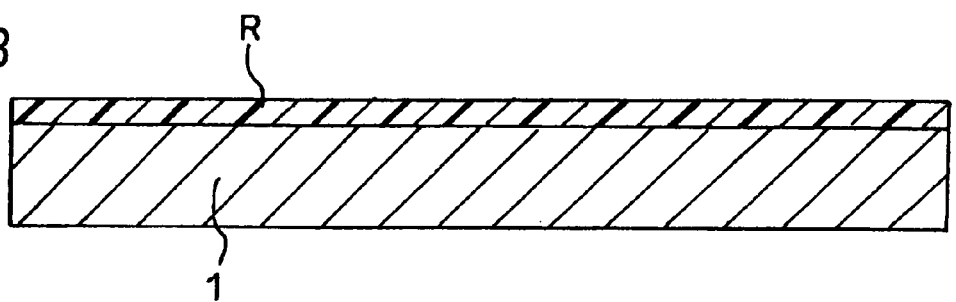
Figure 8C:
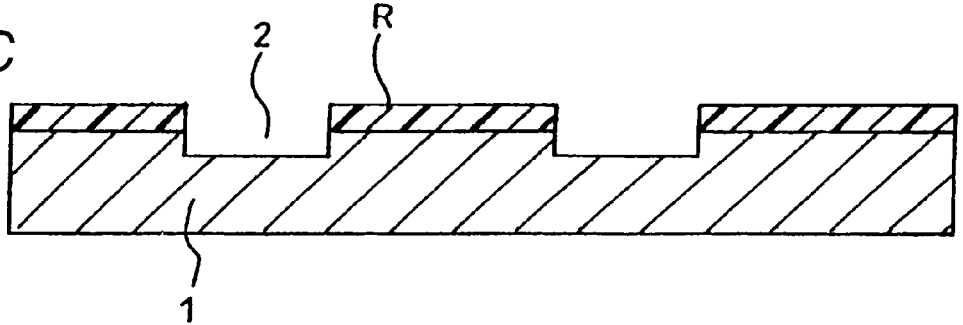
Figure 8D:
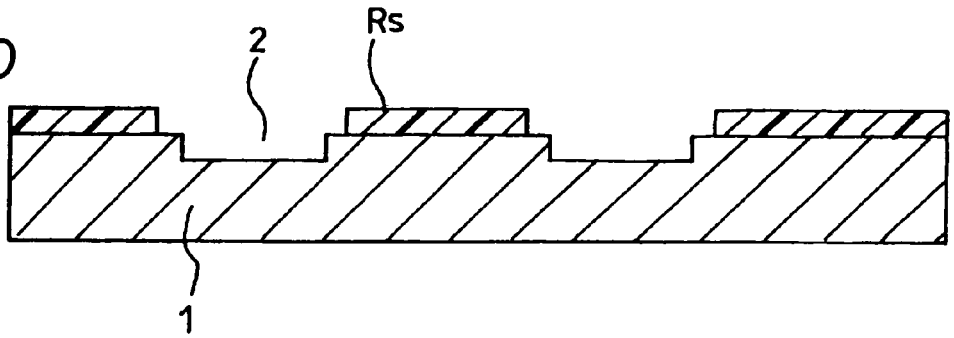

As shown in FIGS. 8A to 8C, the manufacturing process from the beginning to the formation of the groove portion 2 is the same as the manufacturing process explained in the first embodiment referring to FIGS. 4A to 4C. As shown in FIG. 8D, after heated at 500° C. for 30 minutes, resist pattern R is shrunk so that resist pattern $R_s$ is formed, and the peripheral portion of the groove portion 2 is exposed.

After that, as shown in FIG. 9A, while resist pattern $R_s$ is being left as it is, the device is dipped in a plating solution containing a nickel sulfonate water solution, and the nickel layer 3a, which is the barrier layer 3a, is formed by means of electrolytic plating. At this time, the barrier layer 3a is formed so that it can reach the flat portion in the periphery of the groove portion 2 along the inner wall of the groove portion 2.

Next, as shown in FIG. 9B, a gold layer, which is the first conductor layer 3b, is successively formed, and the first conductor layer in the flat portion is removed by means of anisotropic etching.

Further, as shown in FIG. 9C, a nickel layer, which is the second conductor layer 3c, is successively laminated on the first conductor layer 3b by means of electrolytic plating.

Further, a gold layer, which is the third conductor layer 3d, is formed.

Finally, as shown in FIG. 9D, resist pattern $R_s$ is removed. In this way, a lead frame of the second embodiment of the present invention is formed.

Assembling of the lead frame of the semiconductor device of the second embodiment is conducted in the same manner as that of the first embodiment.

As shown in FIG. 10, in the thus formed semiconductor device, the entire surface is covered with the first conductor layer comprising the gold layer. Therefore, the second conductor layer made of nickel is not exposed to the surface. Accordingly, it is possible to form a stable semiconductor device in which no surface is oxidized and the life is long.

Since the barrier layer 3a is provided, even when wire bonding is conducted on the third conductor layer by solder of high temperatures, there is no possibility that the first conductor layer reacts with the lead frame body.

In the above embodiment, explanations are made into the assembly of a bipolar transistor. However, it should be noted that the present invention is not limited to the above discrete element. Of course, the present invention can be applied to IC and LSI.

As explained above, according to the lead frame of the present invention, it is possible to form a highly accurate, reliable, thin type semiconductor device.

According to the method of manufacturing a lead frame of the present invention, since a portion of the metallic substrate is selectively, lightly etched and a lead terminal is formed in this groove portion, a thin type semiconductor device can be very easily formed.

According to the present invention, it is possible to provide a highly reliable thin type semiconductor device.

According to the method of manufacturing a semiconductor device of the present invention, no positional shift is caused and a highly reliable thin type semiconductor device can be assembled at a high yield.

The present invention is not limited to the embodiments and the description thereof at all. If various changes which can be easily conceived by those skilled in the art are not departed from the description of the scope of claim, they may be contained in the present invention.

What is claimed is:

1. A lead frame comprising:
   a lead frame body comprising a sheet-shaped body made of metal;
   a groove portion for forming a lead which is formed by a predetermined depth in a lead forming region on a surface of the lead frame body; and
   a lead having a portion which protrudes from the groove portion laterally onto the surface of the lead frame body so as to be in contact with said surface, the lead completely filling the groove portion and being made of material different from material of the lead frame body, the lead including: a first conductor layer formed in the groove portion;
   a second conductor layer formed on the first conductor layer; and
   a third conductor layer formed on the second conductor layer, wherein
   the first conductor layer is assembled to an assembling member, and
   the third conductor layer is assembled to a die pad of a semiconductor chip,
   wherein the lead includes a barrier layer for suppressing a reaction between the lead frame body and the first conductor layer, the barrier layer being provided on a part of the groove portion so as to be in contact with the lead frame body in the groove portion, and
   wherein the barrier layer is made of any one of nickel, titanium or tungsten.

2. A lead frame according to claim 1, wherein the first conductor layer covers an entire inner wall of the groove portion.

3. A lead frame according to claim 1, wherein an interface of the first and the second conductor layer is located above the surface of the lead frame body.

4. A lead frame according to claim 1, wherein the barrier layer is made of nickel.

5. A lead frame according to claim 1, wherein the first conductor layer is made of metal capable of forming an alloy together with solder.

6. A lead frame according to claim 1, wherein the film thickness of the first and the second conductor layer is 0.5 to 2 μm.

7. A lead frame according to claim 1, wherein the first conductor layer comprises a gold layer.

8. A lead frame according to claim 1, wherein the third conductor layer comprises a gold layer.

9. A lead frame according to claim 1, wherein the second conductor layer comprises a metallic layer, the primary component of which is nickel.

* * * * *